United States Patent [19]

Mizuno

[11] Patent Number: 5,293,754
[45] Date of Patent: Mar. 15, 1994

[54] LIQUID COOLANT CIRCULATING SYSTEM

[75] Inventor: Tsukasa Mizuno, Tokyo, Japan

[73] Assignee: NEC Corporation, Tokyo, Japan

[21] Appl. No.: 32,401

[22] Filed: Mar. 12, 1993

Related U.S. Application Data

[63] Continuation of Ser. No. 912,986, Jul. 14, 1992, abandoned.

[30] Foreign Application Priority Data

Jul. 19, 1991 [JP] Japan .................. 3-203712

[51] Int. Cl.⁵ .................. F25D 17/02; F28D 15/00
[52] U.S. Cl. .................. 62/185; 62/259.2; 165/104.27; 165/40
[58] Field of Search .......... 257/715; 165/40, 104.27, 165/104.33; 62/185, 201, 259.2, 119; 361/385; 363/141

[56] References Cited

U.S. PATENT DOCUMENTS

| | | | |
|---|---|---|---|
| 2,357,706 | 9/1944 | Toepperwein . | |
| 3,586,101 | 6/1971 | Chu et al. ............... | 165/101 |
| 3,774,677 | 11/1973 | Antonetti et al. ......... | 165/39 |
| 4,158,875 | 6/1979 | Tajima et al. ............ | 361/384 |
| 4,245,273 | 1/1981 | Feinberg et al. .......... | 361/382 |
| 4,686,606 | 8/1987 | Yamada et al. ........... | 361/385 |
| 4,712,158 | 12/1987 | Kikuchi et al. ........... | 361/385 |
| 4,721,996 | 1/1988 | Tustaniwskyj et al. ..... | 357/82 |
| 4,729,424 | 3/1988 | Mizuno et al. ........... | 165/30 |
| 4,748,495 | 5/1988 | Kucharek ............... | 357/82 |
| 4,750,086 | 6/1988 | Mittal .................. | 361/382 |
| 4,783,721 | 11/1988 | Yamamoto et al. ........ | 361/382 |
| 4,897,762 | 1/1990 | Daikoku et al. .......... | 361/382 |
| 4,928,207 | 5/1990 | Chrysler et al. .......... | 361/385 |
| 4,945,980 | 8/1990 | Umezawa ............... | 165/101 |
| 5,023,695 | 6/1991 | Umezawa et al. ......... | 357/82 |
| 5,036,384 | 7/1991 | Umezawa ............... | 357/82 |
| 5,123,478 | 6/1992 | Hosaka ................. | 165/40 X |
| 5,131,233 | 7/1992 | Cray et al. ............. | 165/104.33 X |
| 5,137,079 | 8/1992 | Anderson . | |

FOREIGN PATENT DOCUMENTS

0200221A2  11/1986  European Pat. Off. .
0341950    11/1989  European Pat. Off. .
0480750A2  4/1992   European Pat. Off. .
2126180    10/1972  France .
2413624    7/1979   France .
2636724    3/1990   France .

OTHER PUBLICATIONS

Patent Abstracts of Japan, vol. 014, No. 239 (E-0930) May 21, 1990 & JP-A-02 063 147 (Fujitsu Ltd.) Mar. 2, 1990.

Patent Abstracts of Japan, vol. 012, No. 423 (E-680) Nov. 9, 1988 & JP-A-63 161 653 (Nippon Telegr & Teleph Corp.) Jul. 5, 1988.

(List continued on next page.)

Primary Examiner—William E. Wayner
Attorney, Agent, or Firm—Burns, Doane, Swecker & Mathis

[57] ABSTRACT

According to this invention, a liquid coolant circulating system includes a cooling tank, a discharge pump, a recovery pump, a heat exchanger, a detector, and a controller. The cooling tank is filled with a liquid coolant for immersing an object to be cooled. The discharge pump is arranged on an inlet side of the cooling tank and supplies a liquid coolant to the cooling tank at a predetermined flow rate. The recovery pump is arranged on an outlet side of the cooling tank and recovers a liquid coolant from the cooling tank. The heat exchanger is arranged on an outlet side of the recovery pump and cools a heated liquid coolant to a predetermined temperature and supplies a cooled liquid coolant to the discharge pump. The detector detects a value related to a pressure in the cooling tank. The controller controls the ability of the recovery pump in response to a detection signal from the detector.

14 Claims, 11 Drawing Sheets

OTHER PUBLICATIONS

Patent Abstracts of Japan, vol. 014, No. 022 (E–874) Jan. 17, 1990 & JP-A-01 264 248 (Hitachi Ltd.) Oct. 20, 1989.

Patent Abstracts of Japan, vol. 015, No. 405 (E–1122) Oct. 16, 1991 & JP-A-03 165 098 (Fujitsu Ltd.) Jul. 17, 1991.

Patent Abstracts of Japan, vol. 015, No. 159 (E–1059) Apr. 22, 1991 & JP-A-03 030 459 (Fujitsu Ltd.) Feb. 8, 1991.

European Search Report and annex thereto for Application No. EP 92306414.

"Cooling Technology for the SX Supercomputer", T. Mizuno et al., NEC Research and Development, No. 88, Jan. 1988, Tokyo, Japan, pp. 65–73.

IEEE International Conference on Computer Design: VLSI in Computers, ICCD '83.

Session: The New IBM 4381, "New Internal and External Cooling Enhancements For The Air-Cooled IBM 4381 Module", Oktay, et al., 4 pages (Nov. 1, 1983).

Patent Abstracts of Japan, vol. 15, No. 125 (E–1050), Mar. 27, 1991; and JP-A-3 011 759 (Hitachi Ltd.) Jan. 21, 1991.

Patent Abstracts of Japan, vol. 14, No. 411, (E–973) Sep. 5, 1990; & JP-A-2 155 258 (Fujitsu Ltd.) Jun. 14, 1990.

Patent Abstracts of Japan, vol. 14, No. 268 (E–939), Jun. 11, 1990; & JP-A-2 083 957 (Hitachi Ltd.) Mar. 26, 1990.

Patent Abstracts of Japan, vol. 14, No. 252 (E–934), May 30, 1990; & JP-A-2 073 657 (Hitachi Ltd.) Mar. 13, 1990.

"Counter-Flow Cooling System", IBM Technical Disclosure Bulletin, vol. 8, No. 11, Apr. 1966, p. 1692, by R. C. Chu.

"Conduction Cooling Module", IBM Technical Disclosure Bulletin, vol. 20, No. 11A, Apr. 1978, pp. 4334–4335, by P. Hwang et al.

LIQUID COOLANT CIRCULATING SYSTEM

This application is a continuation of application Ser. No. 07/912,986, filed Jul. 14, 1992.

BACKGROUND OF THE INVENTION

The present invention relates to an immersion cooling system and, more particularly, to a liquid coolant circulating system thereof.

FIG. 11 shows a conventional coolant circulating system. This is a system for circulating and supplying a liquid coolant to an object to be cooled such as a liquid-cooled electronic part. In FIG. 11, reference numeral 1 denotes a buffer tank for absorbing a variation in volume of a coolant 2 caused by a change in temperature; 3, a discharge pump for supplying the coolant 2 in the buffer tank 1 to an object 5 to be cooled such as an electronic part through a pipe 4; 6, a heat exchanger for cooling the coolant 2 which is heated by cooling the object 5 such as an electronic part to a predetermined temperature and returning the coolant to the buffer tank 1; and 7a, a cooling tank in which the object 5 is incorporated. Note that a constant flow rate valve for obtaining a liquid coolant having a predetermined flow rate may be arranged on the outlet side of the discharge pump 3 as needed.

An operation of the coolant circulating system will be described below. The coolant 2 in the buffer tank 1 is supplied to the cooling tank 7a by a discharge pressure of the discharge pump 3 through the pipe 4 to cool the object 5. Thereafter, the coolant 2 is cooled to a predetermined temperature by the heat exchanger 6 and returned to the buffer tank 1.

FIG. 12 shows another conventional coolant circulating system. In FIG. 12, reference numeral 7b denotes a cooling tank filled with an insulating liquid coolant 2. In the coolant circulating system with this arrangement, an object 5 to be cooled, such as an electronic part, is immersed in the insulating liquid coolant 2 and cooled by boiling the coolant 2. Although this insulating liquid coolant 2 is circulated from the buffer tank 1 to the buffer tank 1 through a pipe 4, the cooling tank 7b, and a heat exchanger 6, by the discharge pressure of a discharge pump 3, the insulating liquid coolant 2, the temperature of which rises, can be cooled to a predetermined temperature by the heat exchanger 6. Note that a cooling scheme using a nucleate boiling scheme is used as a cooling scheme in the cooling tank 7b to increase a cooling efficiency.

In the conventional liquid coolant circulating system described above, however, since only the discharge pump 3 is used as a means for circulating the coolant 2, the discharge pump 3 having a high discharge pressure must be used.

In the coolant circulating system shown in FIG. 12, a circulating system consists of only the discharge pump 3. For this reason, a so-called return pressure of a coolant path extending from the outlet of the coolant tank 7b to the buffer tank 1 through the heat exchanger 6 is charged on the coolant in the coolant tank 7b. As a result, since the boiling point of a coolant in the cooling tank 7b rises, boiling is not promoted, and a sufficient cooling effect cannot be obtained. In addition, since a pressure charged on the flow path is also increased, the withstanding pressure of the cooling tank 7a, the heat exchanger 6 and the like constituting the flow path must be excessively increased.

SUMMARY OF THE INVENTION

It is an object of the present invention to provide a liquid coolant circulating system capable of providing a sufficient and stable cooling effect by boiling.

It is another object of the present invention to provide a liquid coolant circulating system capable of setting a withstanding pressure of a flow path constituent to a low pressure.

It is still another object of the present invention to provide a liquid coolant circulating system requiring no discharge pump having a high discharge ability.

In order to achieve the above objects, according to the present invention, there is provided a liquid coolant circulating system comprising a cooling tank filled with a liquid coolant for immersing an object to be cooled, a discharge pump, arranged on an inlet side of the cooling tank, for supplying a liquid coolant to the cooling tank at a predetermined flow rate, a recovery pump, arranged on an outlet side of the cooling tank, for recovering a liquid coolant from the cooling tank, a heat exchanger, arranged on an outlet side of the recovery pump, for cooling a heated liquid coolant to a predetermined temperature and supplying a cooled liquid coolant to the discharge pump, detecting means for detecting a value related to a pressure in the cooling tank, and control means for controlling the ability of the recovery pump in response to a detection signal from the detecting means.

DESCRIPTION OF THE PREFERRED EMBODIMENTS

Figure 1:
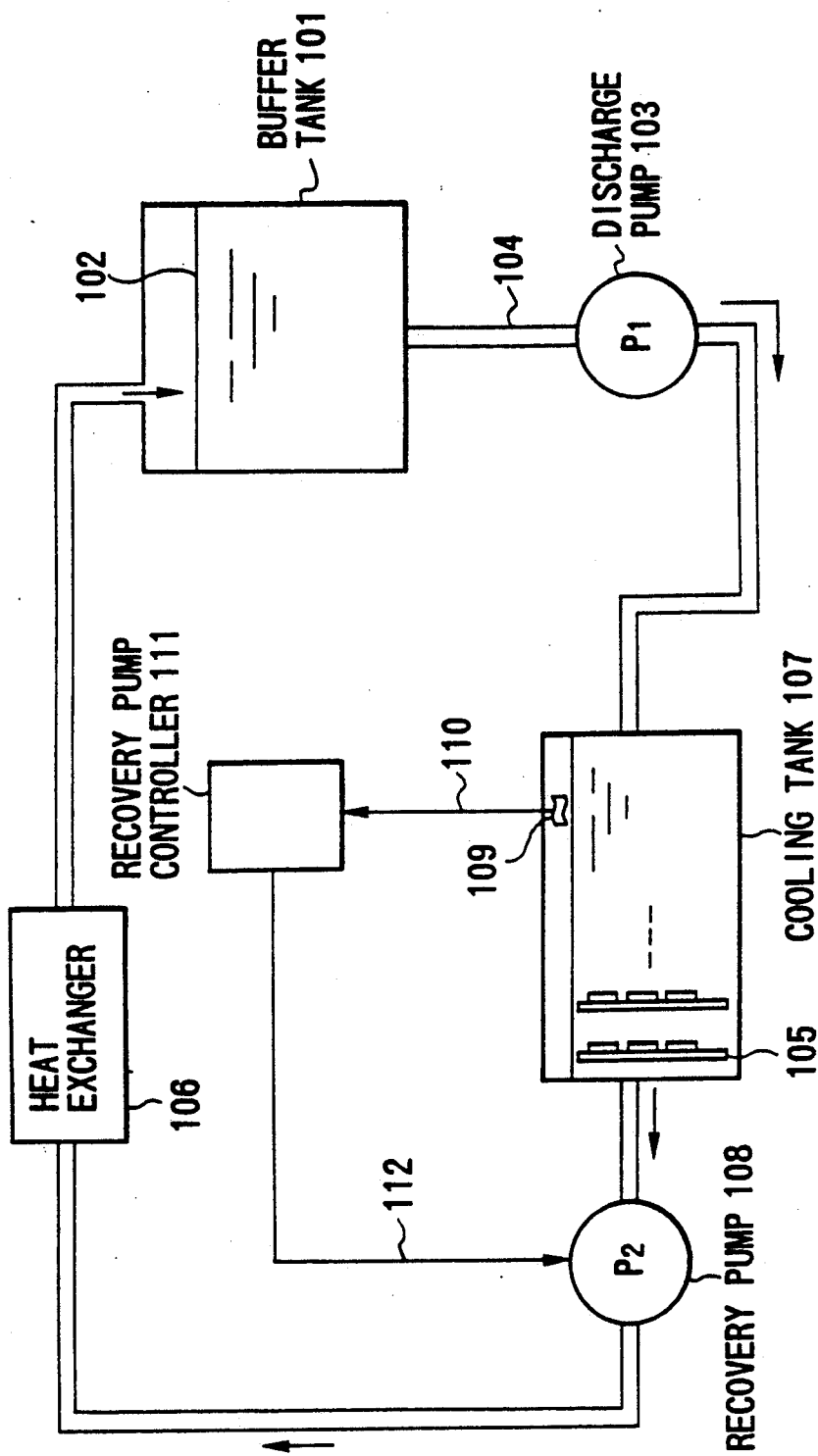
FIG. 1 is a view showing an arrangement of a liquid coolant circulating system according to an embodiment of the present invention.

FIG. 1 shows a liquid coolant circulating system according to an embodiment of the present invention. In FIG. 1, reference numeral 101 denotes a buffer tank; 103, a discharge pump; 106, a heat exchanger; 107, a cooling tank; 108, a recovery pump; 109, a pressure sensor; and 111, a recovery pump controller. The buffer tank 101 absorbs a variation in volume of a coolant 102 caused by a change in temperature. The discharge pump 103 supplies the coolant 102 in the buffer tank 101 to an object to be cooled 105 such as an electronic part through a pipe 104. The heat exchanger 106 cools the coolant 102, which is heated by cooling the object 5 such as an electronic part, to a predetermined temperature, and the heat exchanger 106 returns the coolant 102 to the buffer tank 101. The cooling tank 107 immerses the object 105 in the coolant 102 consisting of an insulating liquid. The recovery pump 108 is arranged on the outlet side of the cooling tank 107 for the coolant 102, discharges the coolant 102 from the cooling tank 107, and returns it to the buffer tank 101 through the heat exchanger 106. The pressure sensor 109 detects a pressure in the cooling tank 7 and outputs a resultant pressure detection signal through a detection line 110. The recovery pump controller 111 receives the pressure detection signal, controls a recovery amount of the coolant 102 of the recovery pump 108 such that the pressure in the cooling tank 107 is set at the predetermined pressure, and outputs a control signal to the recovery pump 108 through a control line 112 to prevent the boiling point of the coolant 102 from rising. Arrows indicate flowing directions of the coolant 102.

Note that an inverter-controlled pump capable of continuously varying a coolant transfer amount is used as the recovery pump 108.

An operation of the liquid coolant circulating system with the above arrangement will be described below. The object 105 to be cooled, such as an electronic part, is immersed in the coolant 102 in the cooling tank 107 and cooled by boiling the coolant 102 in a nucleate boiling scheme. This coolant 102 is supplied from the buffer tank 101 to the cooling tank 107 through the pipe 104 by the discharge pump 103 at a predetermined flow rate. The pressure sensor 109 detects a pressure in the cooling tank 107 and outputs a pressure detection signal to the recovery pump controller 111 through the detection line 110. When the recovery pump controller 111 sends a control signal to the recovery pump 108 through the control line 112, the recovery pump 108 is operated, and a recovery amount of the coolant 102 in the cooling tank 107 is controlled to always set the pressure in the cooling tank 107 to the predetermined pressure (example: atmosphere), thereby preventing the boiling point of the coolant 102 from rising. The heated coolant 102 is supplied to the heat exchanger 106 by the recovery pump 108, cooled to a predetermined temperature, and returned to the buffer tank 101.

Figure 2:
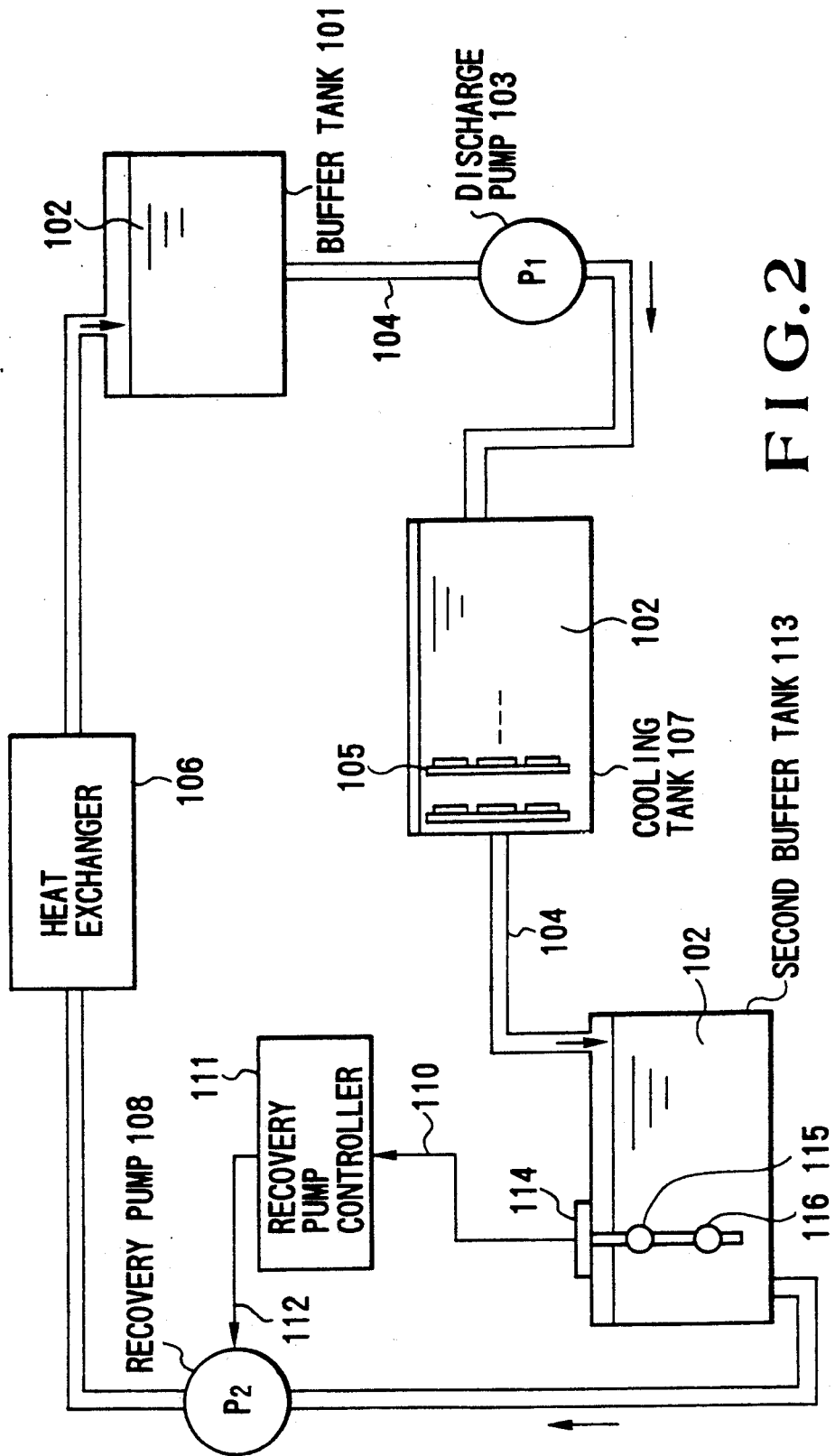
FIG. 2 is a view showing an arrangement of a liquid coolant circulating system according to another embodiment of the present invention.

FIG. 2 shows a liquid coolant circulating system according to another embodiment of the present invention. The same reference numerals as in FIG. 1 denote the same parts in FIG. 2, and a description thereof will be omitted. In FIG. 2, reference numeral 113 denotes a second buffer tank connected to the outlet side of a cooling tank 107 for a coolant 102 through a pipe 104, and reference numeral 114 denotes a liquid-level sensor having a high liquid-level float 115 for detecting a high liquid level of the coolant 102 in the second buffer tank 113 and a low liquid-level float 116 for detecting a low liquid level. The liquid-level sensor 114 detects these floats and outputs a detection signal to the a recovery pump controller 111 through a detection line 110.

An operation of the liquid coolant circulating system with the above arrangement will be described below. An object 105 to be cooled, such as an electronic part, is immersed in the coolant 102 in the cooling tank 107 and cooled by boiling the coolant 102. This coolant 102 is supplied from a buffer tank 101 to the cooling tank 107 through a pipe 104 by a discharge pump 103 at a predetermined flow rate. When the liquid level of the coolant 102 in the second buffer tank 113 rises to reach a high liquid level, the liquid-level sensor 114 detects the high liquid-level float 115 and outputs a detection signal to a recovery pump controller 111 through the detection line 110. When this recovery pump controller 111 sends a control signal to a recovery pump 108 through a control line 112, the recovery pump 108 is operated to take out the coolant 102 from the second buffer tank 113.

When the liquid level of the coolant 102 in the second buffer tank 113 falls to reach the low liquid level, the liquid-level sensor 114 detects the low liquid-level float 116 and outputs a detection signal to the recovery pump controller 111 through the detection line 110. At this time, the recovery pump controller 111 sends a control signal to the recovery pump 108 through the control line 112 to stop the operation of the recovery pump 108. In this manner, since the liquid level of the coolant 102 in the second buffer tank 113 can be controlled between the levels of the high liquid-level float 115 and the low liquid-level float 116, a pressure in the cooling tank 107 can be kept almost at the predetermined pressure, and the boiling point of the coolant 102 can be prevented from rising, thereby obtaining efficient cooling performance by boiling. The heated coolant 102 is sent to a heat exchanger 106 by the recovery pump 108, cooled to a predetermined temperature, and returned to the buffer tank 101.

Figure 3:
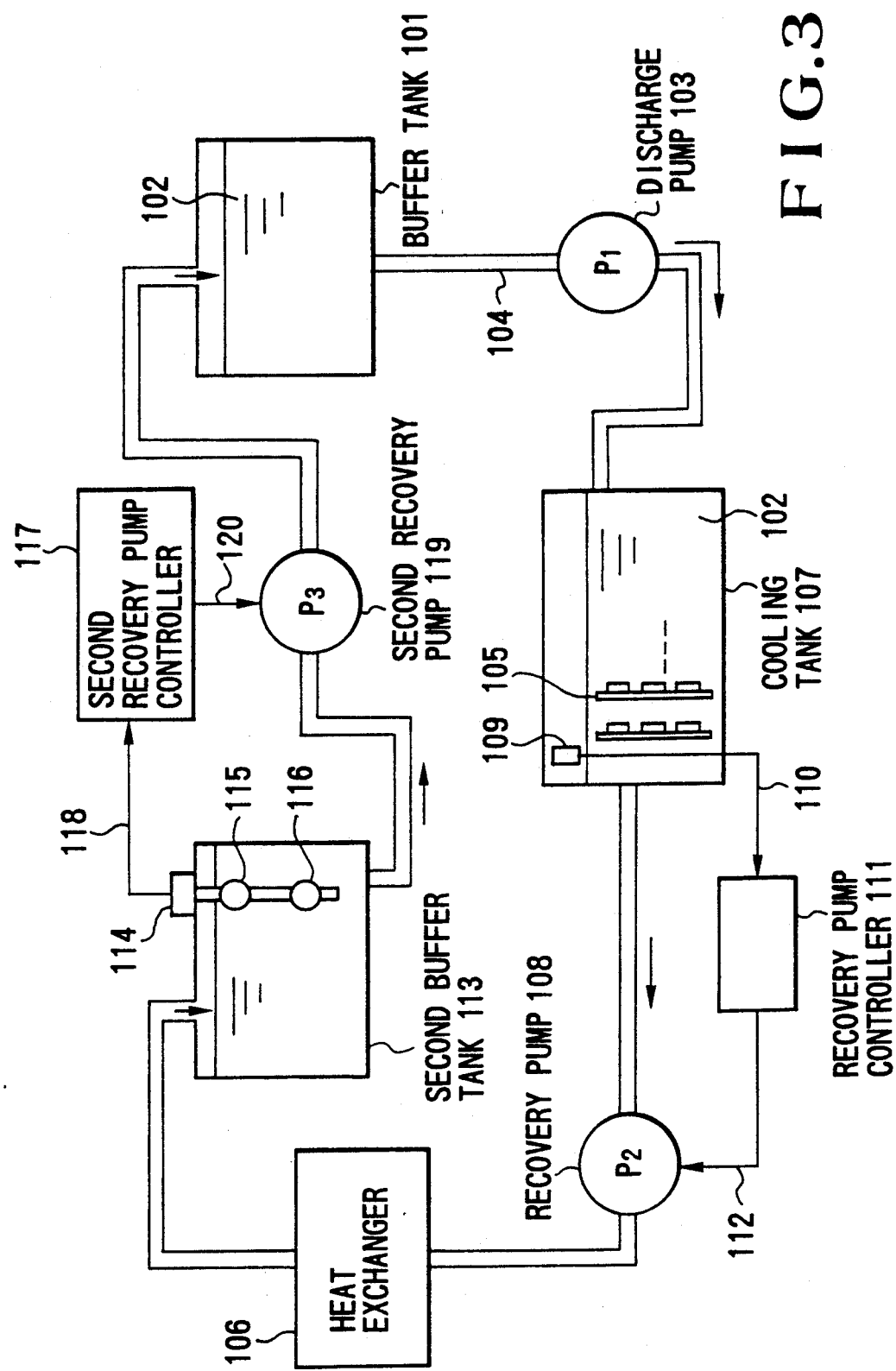
FIG. 3 is a view showing an arrangement of a liquid coolant circulating system according to still another embodiment of the present invention.

FIG. 3 shows an arrangement of a liquid coolant circulating system according to still another embodiment of the present invention. This liquid coolant circulating system is obtained by combining the systems shown in FIGS. 1 and 2. In FIG. 3, reference numeral 117 denotes a second recovery pump controller for receiving a detection signal from a liquid-level sensor 114 through a detection line 118; 119, a second recovery pump for receiving an output signal from the second recovery pump controller 117 through a control line 120. The liquid-level sensor 114 is arranged on a second buffer tank 113 arranged on the outlet side of a heat exchanger 106.

An operation of the liquid coolant circulating system with the above arrangement will be described below. An object 105 to be cooled, such as an electronic part, is immersed in a coolant 102 in a cooling tank 107 and cooled by boiling the coolant 102. This coolant 102 is supplied from a buffer tank 101 to the cooling tank 107 through a pipe 104 by the discharge pump 103 at a predetermined flow rate. A pressure sensor 109 detects a pressure in the cooling tank 107 and outputs a pressure detection signal to a recovery pump controller 111 through a detection line 110. When the recovery pump controller 111 sends a control signal to a recovery pump 108 through a central line 112, the recovery pump 108 is operated, and a recovery amount of the coolant 102 in the cooling tank 107 is continuously controlled to always set the pressure in the cooling tank 107 to the predetermined pressure, thereby preventing the boiling point of the coolant 102 from rising.

The heated coolant 102 is supplied to the heat exchanger 106 by the recovery pump 108, cooled to a predetermined temperature, and supplied to the second buffer tank 113. When the liquid level of the coolant 102 in the second buffer tank 113 rises to reach a high liquid level, the liquid-level sensor 114 detects a high liquid-level float 115 and outputs a detection signal to the second recovery pump controller 117 through the detection line 118. When this second recovery pump controller 117 sends a control signal to the second recovery pump 119 through the control line 120, the second recovery pump 119 is operated to supply the coolant 102 in the second buffer tank 113 to the buffer tank 101.

When the liquid level of the coolant 102 in the second buffer tank 113 falls to reach the low liquid level, the liquid-level sensor 114 detects a low liquid-level float 116 and outputs a detection signal to the second recovery pump controller 117 through the detection line 118. At this time, the second recovery pump controller 117 sends a control signal to the second recovery pump 119 through the control line 120 to stop the operation of the second recovery pump 119. In this manner, the liquid level of the coolant 102 in the second buffer tank 113 can be controlled between the levels of the high liquid-level float 115 and the low liquid-level float 116. In addition, since the pressure in the cooling tank 107 can be kept at the predetermined pressure, the boiling point of the coolant 102 can be prevented from rising, thereby obtaining stable cooling performance by boiling.

In this embodiment, the heat exchanger 106 is connected to the inlet of the second buffer tank 113. However, the embodiment is not limited to this arrangement, and the heat exchanger 106 may be connected to the outlet of the second buffer tank 113.

Figure 4:
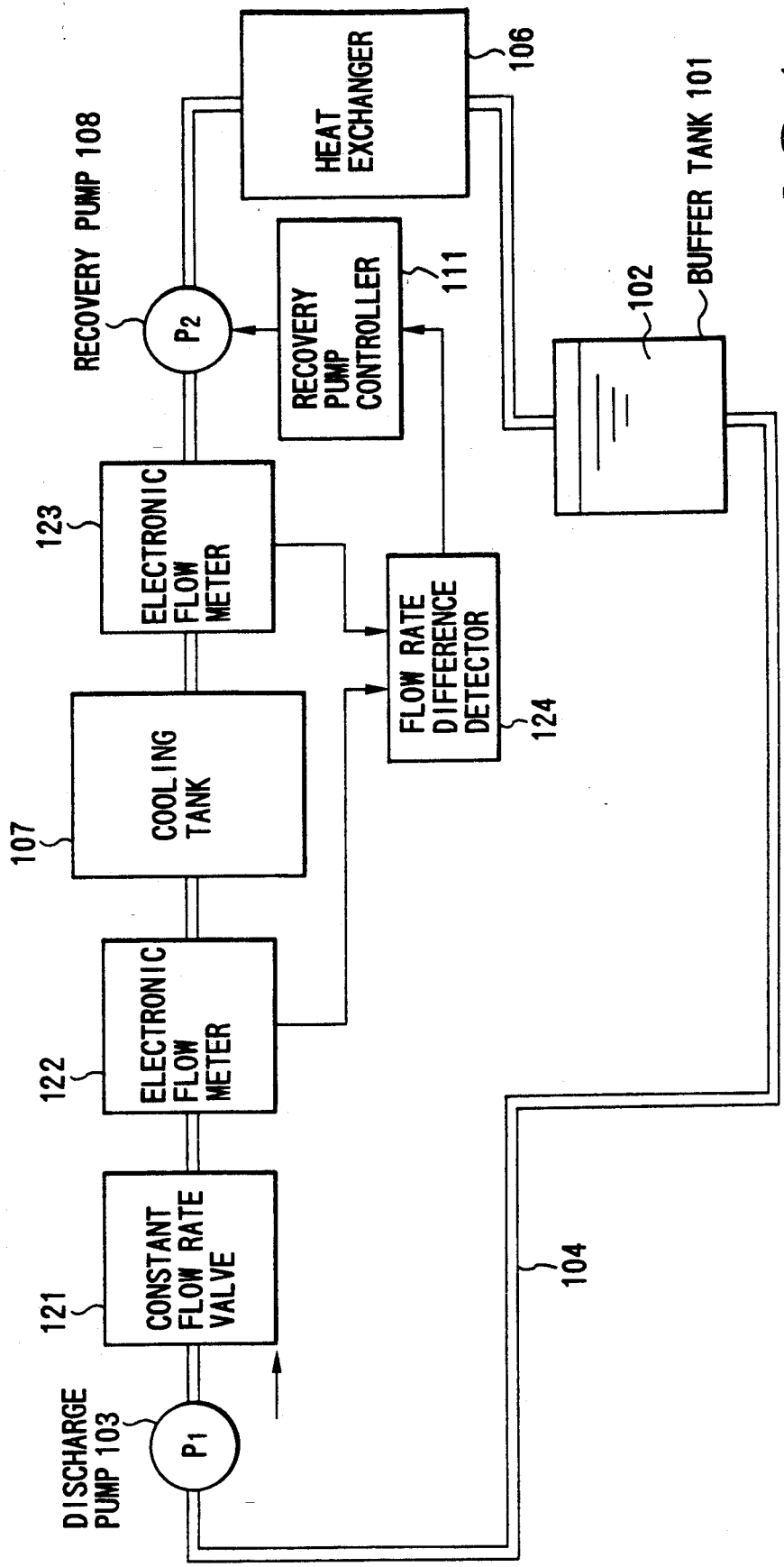
FIG. 4 is a view showing an arrangement of a liquid coolant circulating system according to still another embodiment of the present invention.

FIG. 4 shows still another embodiment of the present invention, and only different points between FIG. 1 and FIG. 4 will be described below. In FIG. 4, reference numeral 121 denotes a constant flow rate valve, arranged on the outlet side of a discharge pump 103, for supplying a coolant at a predetermined flow rate; 122 and 123, electronic flowmeters, arranged on the inlet and outlet sides of a cooling tank 107, for detecting a flow rate of a coolant which actually flows; and 124, a flow rate difference detector for detecting a flow rate difference on the basis of the detection outputs from the electronic flowmeters 122 and 123 to output the flow rate difference to a recovery pump controller 111.

A control operation of this embodiment will be described below. A discharge amount of a coolant 102 from the discharge pump 103 to the cooling tank 107 is fixedly determined by the constant flow rate valve 121. An amount of the coolant 102 recovered by a recovery pump 108 from the cooling tank 107 is controlled as follows. The detection outputs from the two electronic flowmeters 122 and 123 are sent to the flow rate difference detector 124. This detector 124 detects a flow rate difference on the basis of the outputs from the two electronic flowmeters 122 and 123 and sends the detected flow rate difference to the recovery pump controller 111. The recovery pump controller 111 controls a recovery amount of the recovery pump 108 using, e.g., linear control performed by an inverter, to set the detected flow rate difference to zero. Therefore, the pressure in the cooling tank 107 is kept almost at the predetermined pressure because an amount of the coolant 102 which is supposed to flow in the cooling tank 107 is positively recovered.

Figure 5:
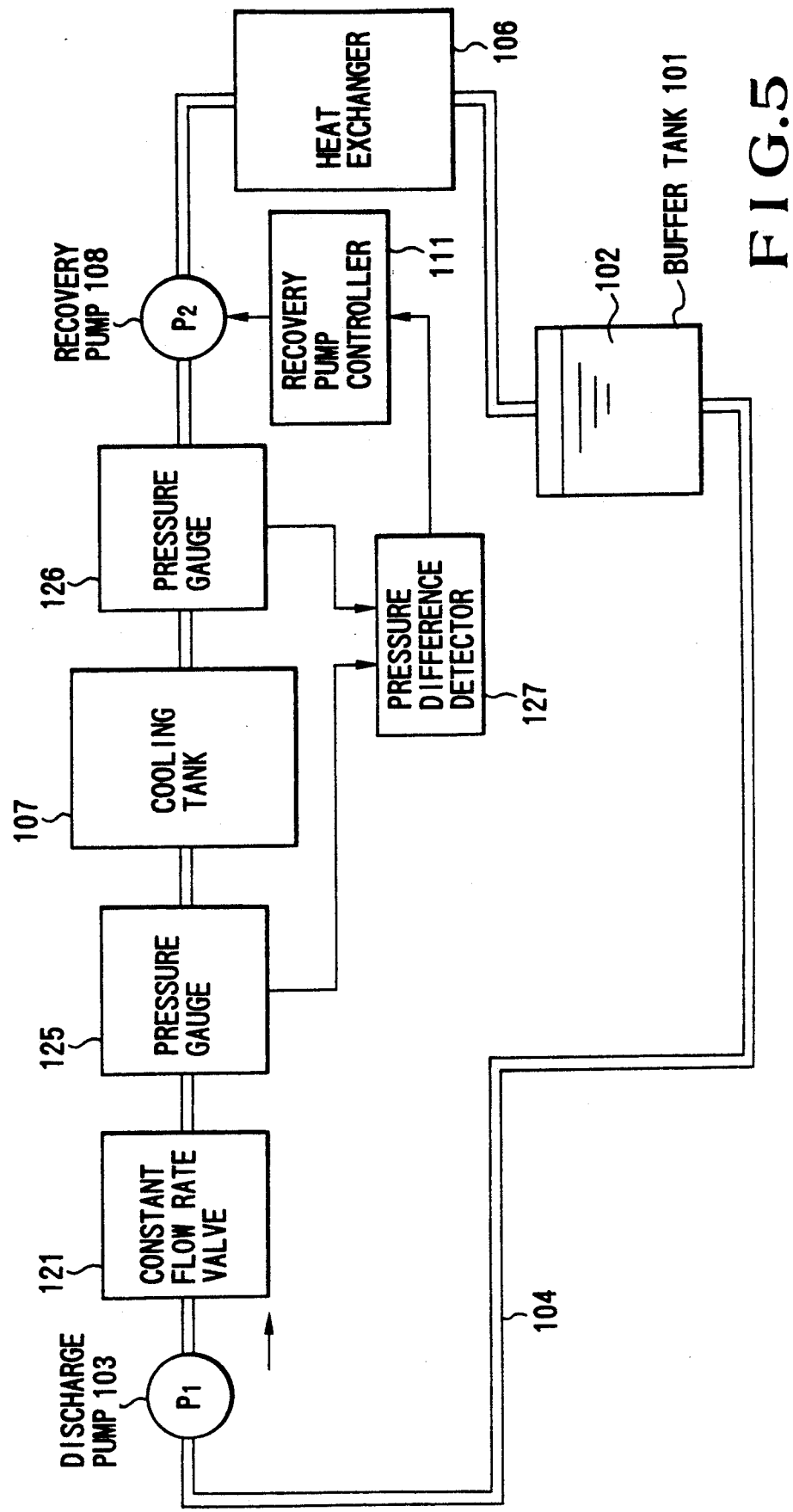
FIG. 5 is a view showing an arrangement of a liquid coolant circulating system according to still another embodiment of the present invention.

FIG. 5 shows still another embodiment of the present invention. In this embodiment, the electronic flowmeters 122 and 123 of the system shown in FIG. 4 are replaced with pressure gauges 125 and 126, and the flow rate difference detector 124 in FIG. 4 is replaced with a pressure difference detector 127. As a control procedure, only the recovery amount of a recovery pump 108 is controlled by a recovery pump controller 111 to adjust a difference of the detected values from the pressure gauges 125 and 126 to predetermined value. In this case, the pressure measured by the pressure gauge 125 can be considered as a positive pressure since the pressure gauge 125 detects a discharge pressure from a discharge pump 103. On the other hand, the pressure measured by the pressure gauge 126 can be considered as a negative pressure since the pressure gauge 126 detects a pressure of the inlet side of the recovery pump 108. Therefore, although the recovery amount is controlled to adjust a difference of the detected values from both the gauges 125 and 126, the recovery amount must be controlled to adjust a sum of the detected values in consideration of positive and negative pressures represented by these values.

Figure 6:
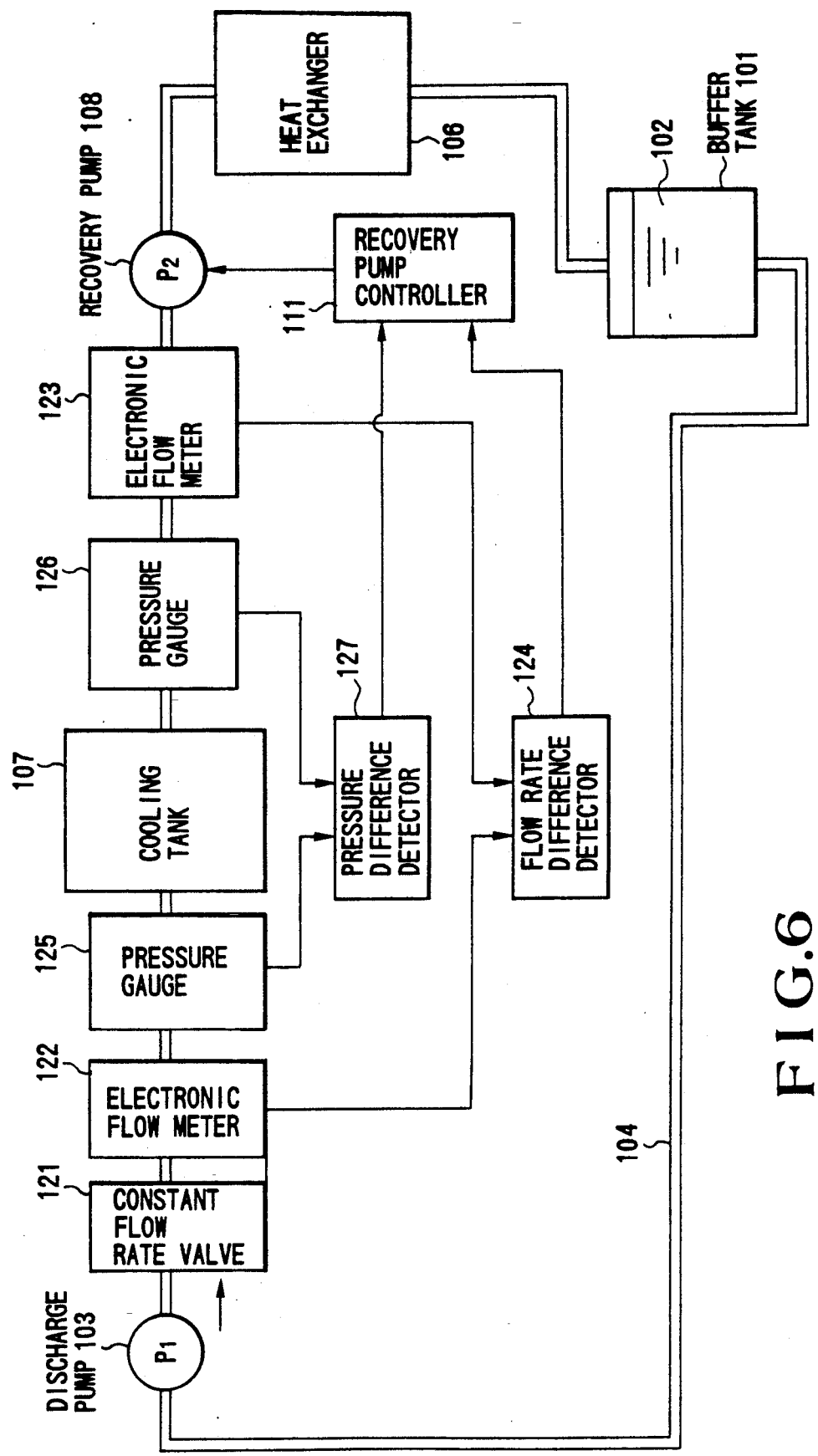
FIG. 6 is a view showing an arrangement of a liquid coolant circulating system according to still another embodiment of the present invention.

FIG. 6 shows still another embodiment of the present invention. In this embodiment, pressure gauges 125 and 126 described in FIG. 5 are additionally connected to the system described in FIG. 4, and a pressure difference detector 127 is additionally arranged to supply a detected pressure difference output to a recovery pump controller 111. As a control procedure, the recovery pump controller 111 controls a recovery amount of a recovery pump 108 using an inverter or the like to set both of a detected flow rate difference and a detected pressure difference to predetermined values.

Figure 7:
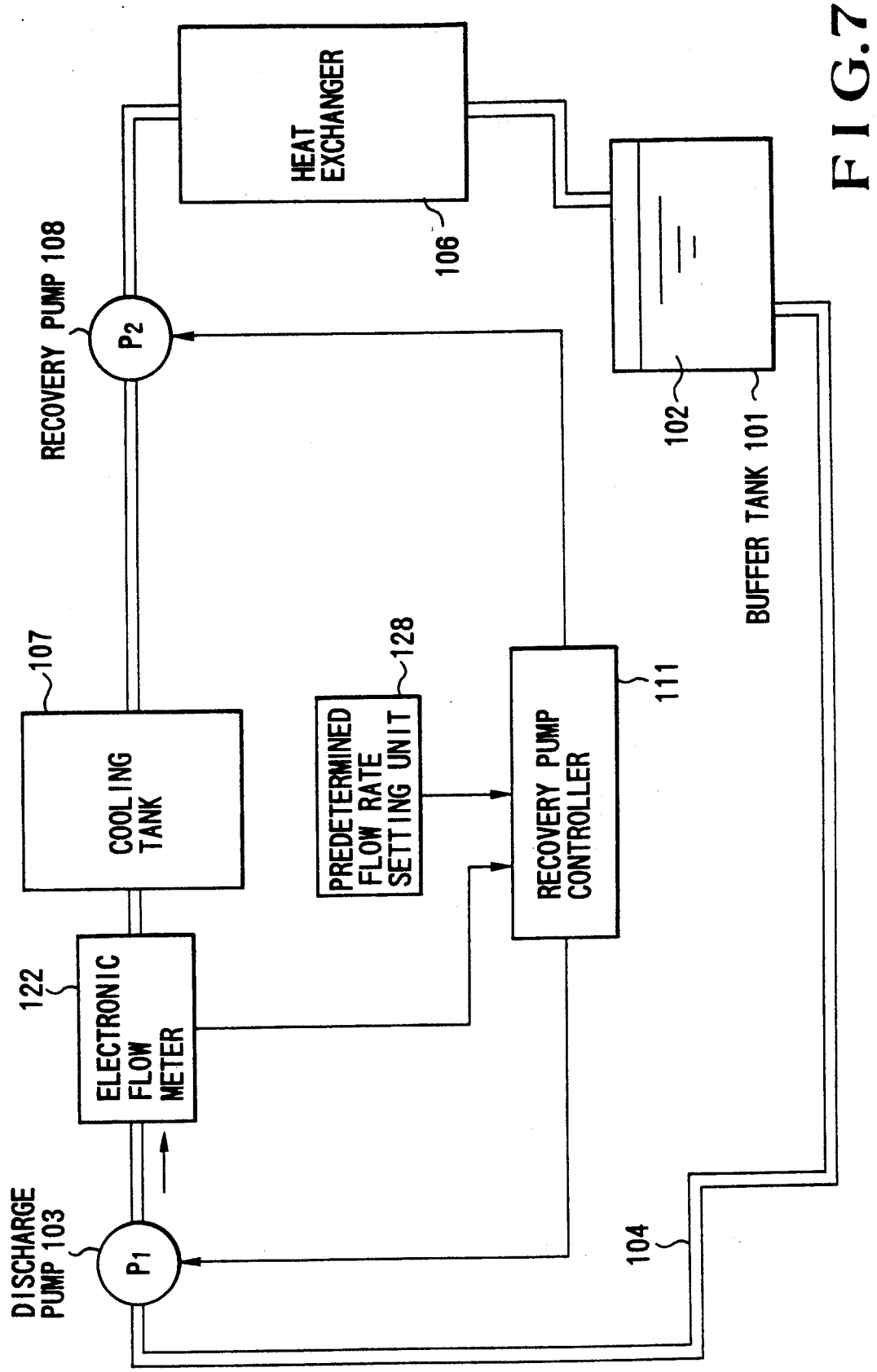
FIG. 7 is a view showing an arrangement of a liquid coolant circulating system according to still another embodiment of the present invention.

FIG. 7 shows still another embodiment of the present invention. In this embodiment, a constant flow rate valve 121 and an electronic flowmeter 123 are omitted, and a predetermined flow rate setting unit 128 for setting a predetermined flow rate value is added to the system shown in FIG. 4.

A control procedure will be described below. A detection output from an electronic flowmeter 122 is sent to a recovery pump controller 111. A predetermined flow rate value is input from the predetermined flow rate setting unit 128 to the controller 111. A discharge pump 103 has the same ability as that of a recovery pump 108. The recovery pump controller 111 simultaneously controls the abilities of the discharge pump 103 and the recovery pump 108 using linear control performed by an inverter such that the detected flow rate value of the electronic flowmeter 122 is equal to the flow rate value set by the predetermined flow rate setting unit 128. Therefore, a pressure in a cooling tank 107 is kept almost at the predetermined pressure.

Figure 8:
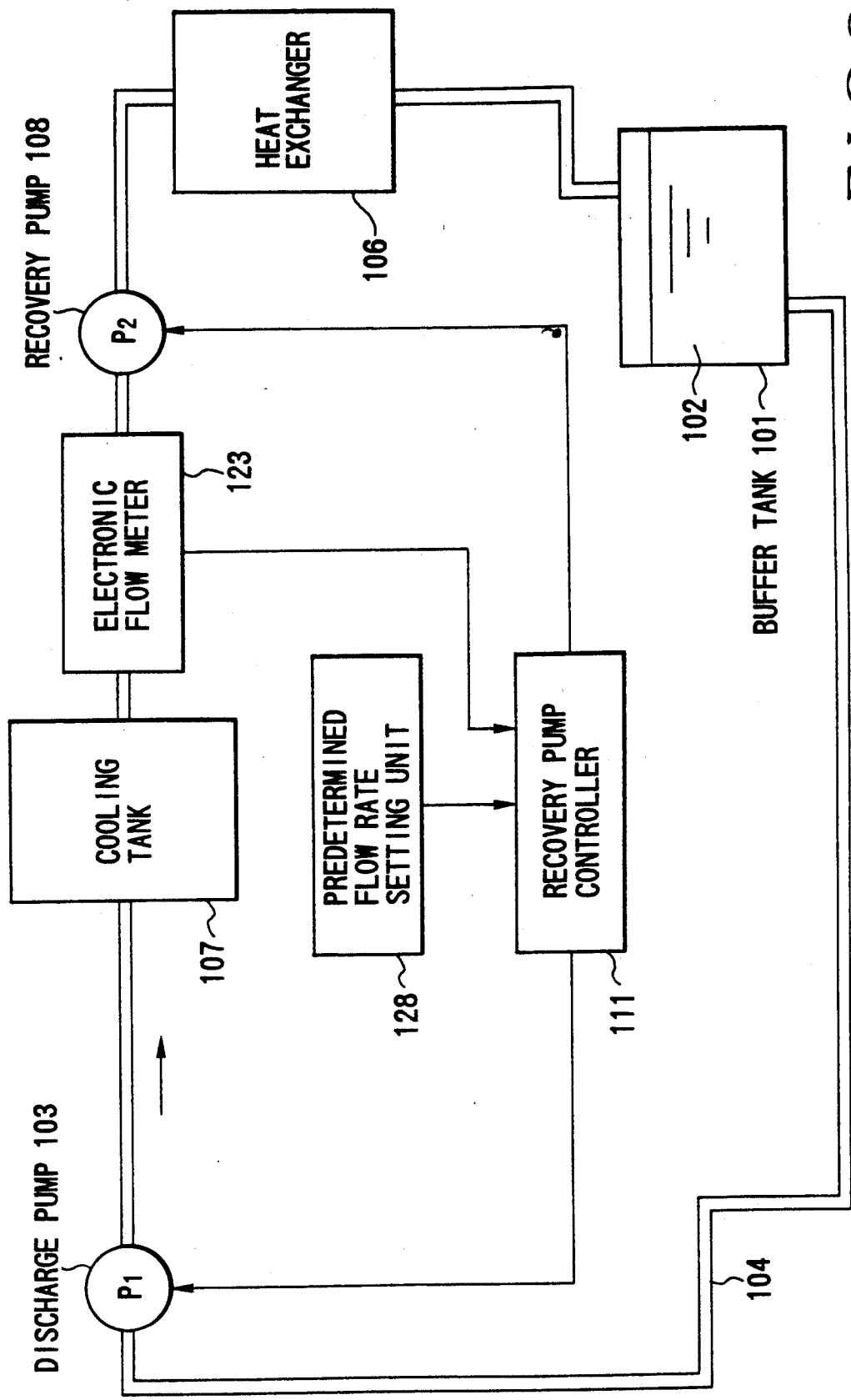
FIG. 8 is a view showing an arrangement of a liquid coolant circulating system according to still another embodiment of the present invention.

FIG. 8 shows still another embodiment of the present invention. In this embodiment, an electronic flowmeter 122 arranged on the inlet side of a cooling tank 107 is omitted in the system shown in FIG. 7, and an electronic flowmeter 123 is arranged on the outlet side of the cooling tank 107.

Figure 9:
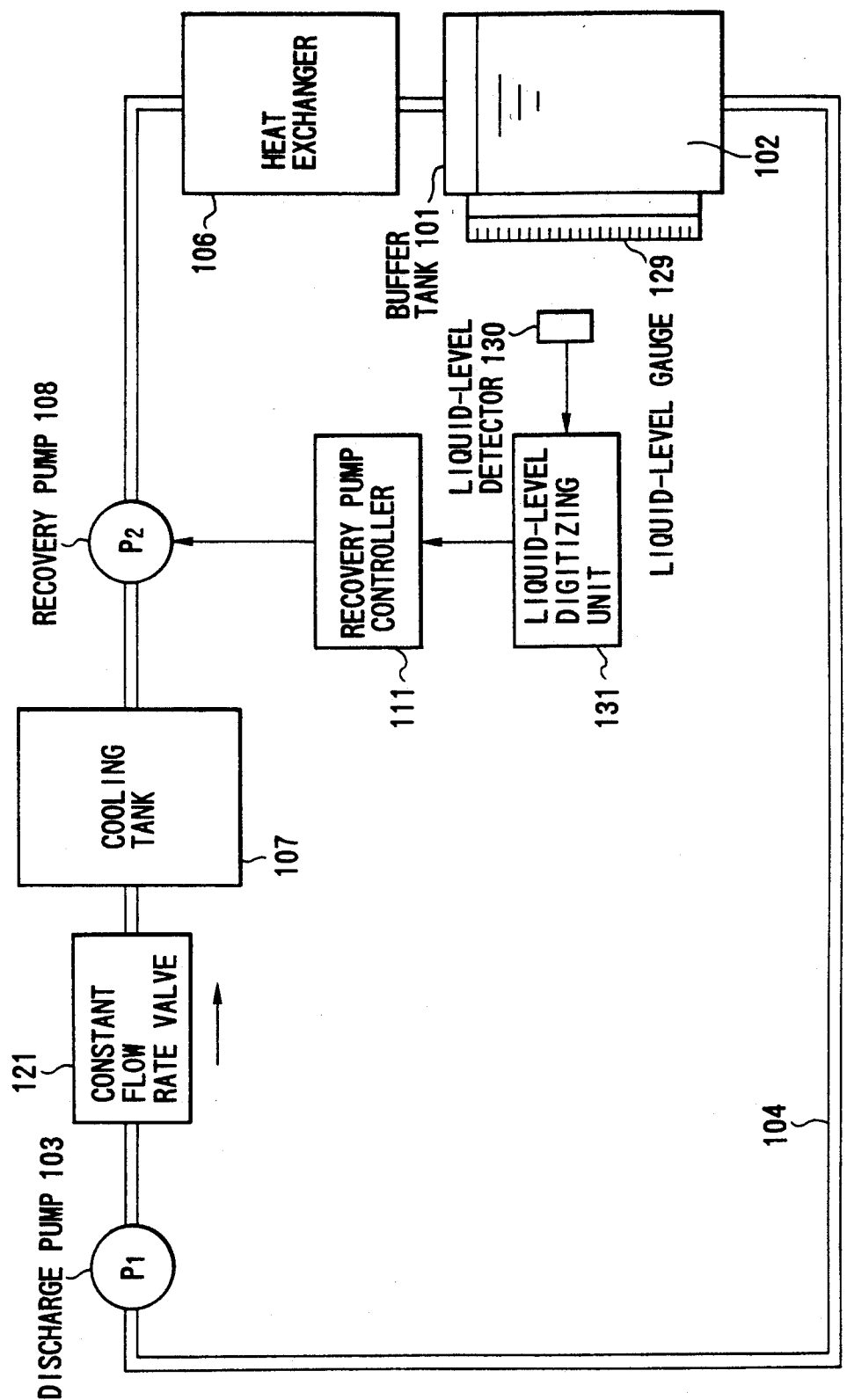
FIG. 9 is a view showing an arrangement of a liquid coolant circulating system according to still another embodiment of the present invention.

FIG. 9 shows still another embodiment of the present invention. In this embodiment, an electronic flowmeter 122 is replaced with a constant flow rate valve 121 in the system shown in FIG. 7, a liquid-level gauge 129 is added to a buffer tank 101, and a liquid-level detector 130 and a liquid-level digitizing unit 131 are arranged in place of the predetermined flow rate setting unit 128 in the system in FIG. 7. According to this embodiment, a control procedure is performed as follows. An amount of a coolant 102 flowing in a cooling tank 107 is fixedly determined by the constant flow rate valve 121. The liquid-level detector 130 (e.g., a camera or the like using a CCD element) always monitors the liquid-level gauge 129 to detect a liquid level in the buffer tank 101. The detected liquid level is converted into a numerical value by the liquid-level digitizing unit 131 and sent to a recovery pump controller 111. This controller controls the ability of a recovery pump 108 on the basis of the input numerical value of the liquid level using an inverter or the like to always set the detected liquid level to be constant. Therefore, a pressure in the cooling tank 107 is kept almost at the predetermined pressure.

Figure 10:
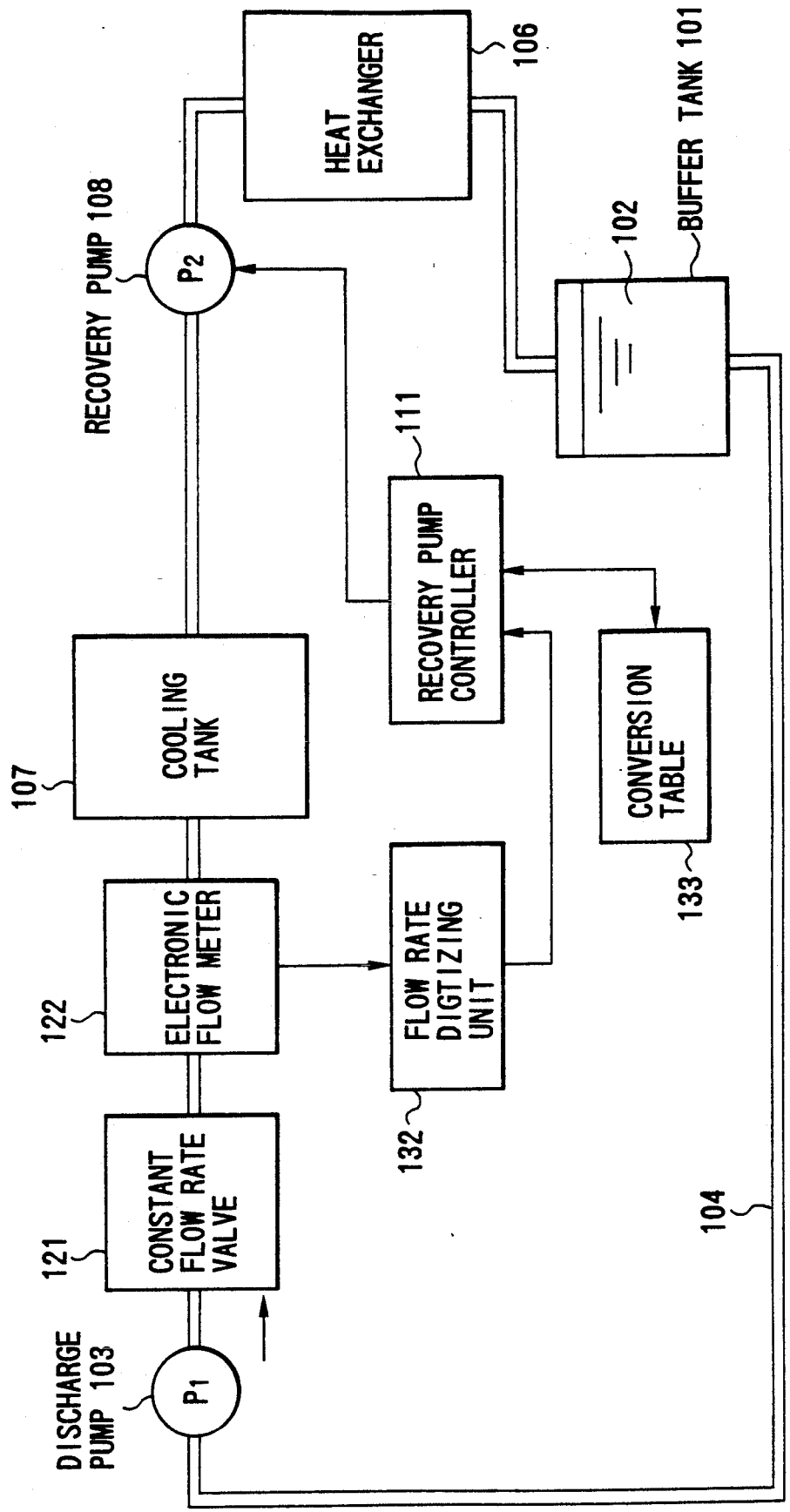
FIG. 10 is a view showing an arrangement of a liquid coolant circulating system according to still another embodiment of the present invention.
Figure 11:
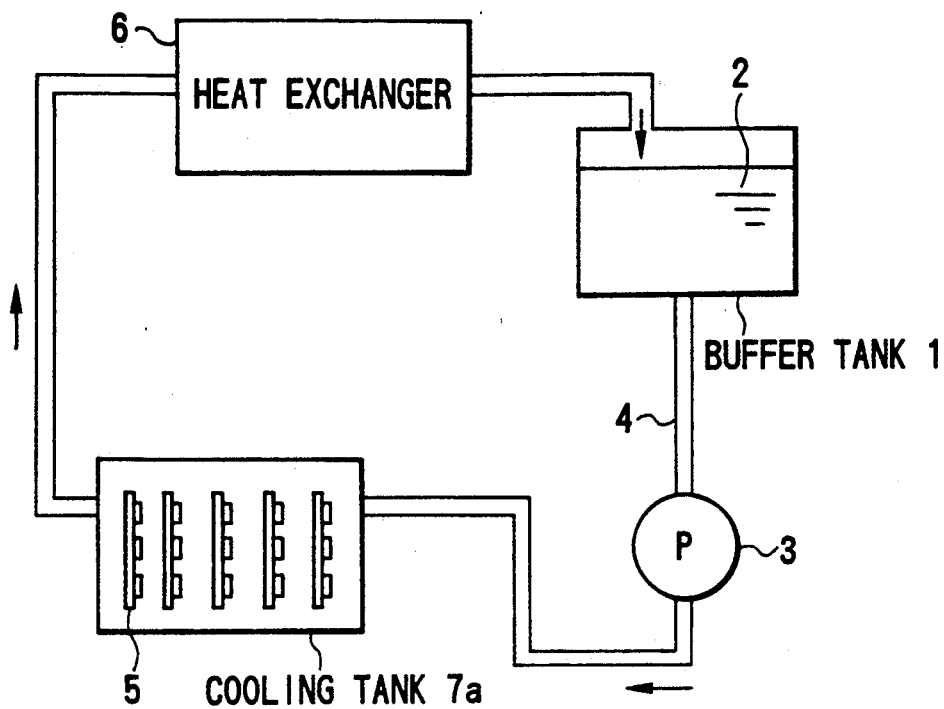
FIG. 11 is a view showing an arrangement of a conventional liquid coolant circulating system.
Figure 12:
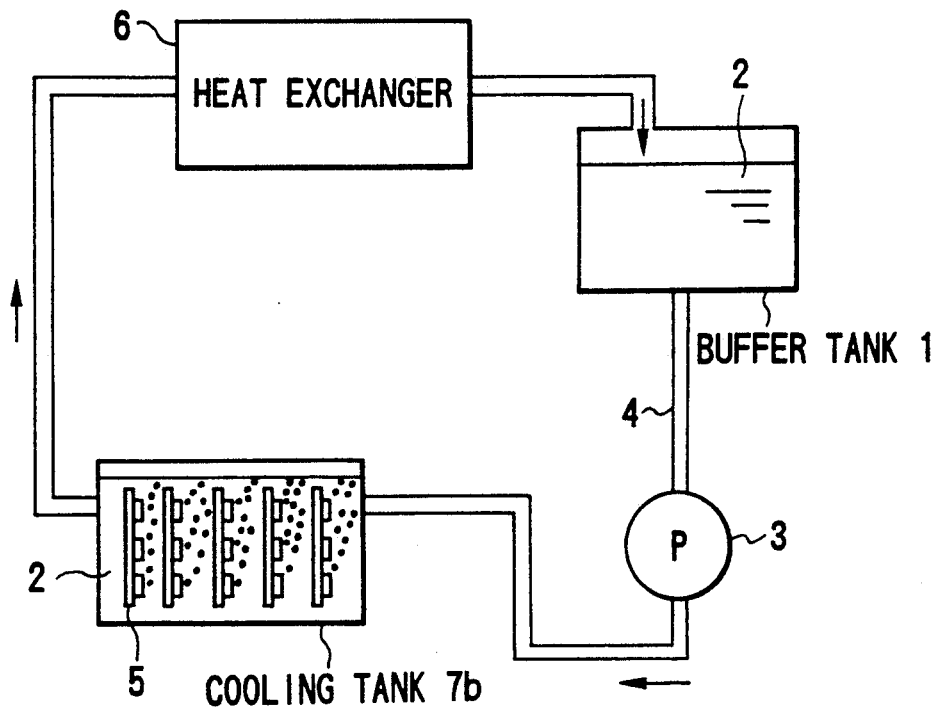
FIG. 12 is a view showing an arrangement of another conventional liquid coolant circulating system.

FIG. 10 shows still another embodiment of the present invention. In this embodiment, the electronic flowmeter 123 arranged on the outlet side of the cooling tank 107 is omitted from the system shown in FIG. 4, and a flow rate digitizing unit 132 connected between an electronic flowmeter 122 and a recovery pump controller 111 and a conversion table 133 to determine the ability of a recovery pump 108 are arranged in the system shown in FIG. 4. The conversion table 133 is connected to the recovery pump controller 111. A detected value of the electronic flowmeter 122 is converted into a numerical value by the flow rate digitizing unit 132 and sent to the recovery pump controller 111. This controller 111 has the conversion table 133 for converting a detected flow rate value into an ability value of the recovery pump 108 required for recovering a liquid coolant having a flow rate equal to the detected flow rate value. The recovery pump controller 111 determines the flow rate of the recovery pump 108 on the basis of the conversion table 133. In this manner, a pressure in the cooling tank 107 is kept almost at the predetermined pressure.

As described above, in a liquid coolant circulating system according to the present invention, a pressure in a cooling tank in which an object to be cooled is immersed is directly or indirectly detected by various sensors or measuring instruments, an operation of a recovery pump is controlled by a detection signal to control discharging of a coolant from the cooling tank. For this reason, the pressure in the cooling tank can be kept at the atmospheric or predetermined pressure, and a stable cooling ability by boiling can be obtained. In addition, the withstanding pressure of the cooling tank and the like constituting a flow path can be advantageously set to be low.

What is claimed is:
1. A liquid coolant circulating system, comprising:
  a cooling tank filled with a liquid coolant for immersing an object to be cooled;
  a discharge pump, arranged on an inlet side of said cooling tank, for supplying a liquid coolant to said cooling tank at a predetermined flow rate;
  a recovery pump, arranged on an outlet side of said cooling tank, for recovering a liquid coolant from said cooling tank;
  a heat exchanger, arranged on an outlet side of said recovery pump, for cooling a heated liquid coolant to a predetermined temperature and supplying a cooled liquid coolant to said discharge pump;
  detecting means for detecting a value related to a pressure in said cooling tank; and
  control means for controlling the ability of said recovery pump in response to a detection signal from said detecting means.

2. A system according to claim 1, wherein said detecting means comprises means, arranged in said cooling tank, for directly measuring a pressure in said cooling tank.

3. A system according to claim 1, wherein said detecting means comprises means, arranged in at least one of liquid coolant flow paths of an inlet and an outlet of said cooling tank, for indirectly measuring a pressure in said cooling tank.

4. A system according to claim 1, wherein said detecting means comprises a pressure sensor for detecting a pressure in said cooling tank and outputting a detection signal, and said control means controls an operation of said recovery pump on the basis of the detection signal from said pressure sensor to always set the pressure in the cooling tank at a predetermined pressure.

5. A system according to claim 1, further comprising a buffer tank arranged between said cooling tank and said recovery pump and filled with a liquid coolant, and a liquid-level sensor, used as said detecting means, for detecting a high liquid level and a low liquid level of the liquid coolant in said buffer tank, and wherein said control means operates said recovery pump by a high liquid-level detection output from said liquid-level sensor to recover the liquid coolant in said cooling tank and stops an operation of said recovery pump by a low liquid-level detection output to stop a recovering operation of the liquid coolant.

6. A system according to claim 1, further comprising a pressure sensor, used as said detecting means, for detecting a pressure in said cooling tank and outputting a detection signal to said control means, a buffer tank arranged on an outlet side of said recovery pump and filled with a liquid coolant, a second recovery pump arranged on an outlet side of said buffer tank, a liquid-level sensor for detecting a high liquid level and a low liquid level of the liquid coolant in said buffer tank, and a second control means for controlling an operation of said second recovery pump by an output from said liquid-level sensor.

7. A system according to claim 1, wherein said detecting means comprises first and second flowmeters respectively connected to an inlet and an outlet of said cooling tank and a flow rate difference detecting means for detecting a flow rate difference on the basis of outputs from said first and second flowmeters, and said control means controls an operation of said recovery pump to set the flow difference detected by said flow rate difference detecting means to a predetermined value.

8. A system according to claim 1, wherein said detecting means comprises first and second pressure gauges respectively connected to an inlet and an outlet of said cooling tank and a pressure difference detecting means for detecting a pressure difference on the basis of outputs from said first and second pressure gauges, and said control means controls an output of said recovery pump to set the pressure difference detected by said pressure difference detecting means to a predetermined value.

9. A system according to claim 1, wherein said detecting means comprises first and second flowmeters respectively connected to an inlet and an outlet of said cooling tank, first and second pressure gauges respectively connected to the inlet and outlet of said cooling tank, a flow rate difference detecting means for detecting a flow rate difference from output from said first and second flowmeters, and a pressure difference detecting means for detecting a pressure difference from outputs from said first and second pressure gauges, and said control means controls an operation of said recovery pump on the basis of outputs from said flow rate difference detecting means and said pressure difference detecting means.

10. A system according to claim 1, further comprising a flowmeter arranged as said detecting means on an inlet side of said cooling tank, and predetermined flow rate setting means for setting a predetermined flow rate value, and wherein said control means controls an operation of said discharge and recovery pumps to set a flow rate value detected by said flowmeter to the flow rate value set by said predetermined flow rate setting means.

11. A system according to claim 1, further comprising a flowmeter arranged on an outlet side of said cooling tank, and a predetermined flow rate setting means for setting a predetermined flow rate value, and wherein said control means controls an operation of said discharge and recovery pumps to set a flow rate value detected by said flowmeter to the flow rate value set by said predetermined flow rate setting means.

12. A system according to claim 1, further comprising a buffer tank arranged on an outlet side of said recovery pump and filled with a liquid coolant, and a liquid-level detecting means as said detecting means for detecting a liquid level in said buffer tank, and wherein said control means controls an operation of said recovery pump such that the liquid level is kept to be constant by an output from said liquid-level detecting means.

13. A system according to claim 1, further comprising a flowmeter arranged as said detecting means on an inlet side of said cooling tank, digitizing means for converting a detection output from said flowmeter into a numerical value, a table for converting a flow rate into an ability value of said recovery pump, and wherein said control means uses a digital flow rate value from said digitizing means to read out an ability value of said recovery pump required for recovering a liquid coolant having a flow rate equal to the digital flow rate value, thereby controlling said recovery pump.

14. A system according to claim 1, further comprising a constant flow rate valve, arranged on an outlet side of said discharge pump, for supplying a liquid coolant at a predetermined flow rate to said cooling tank.

* * * * *